United States Patent
Kida (10) Patent No.: US 8,067,835 B2
(45) Date of Patent: Nov. 29, 2011

(54) METHOD AND APPARATUS FOR MANUFACTURING SEMICONDUCTOR MODULE

(75) Inventor: Tsuyoshi Kida, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 33 days.

(21) Appl. No.: 12/292,392

(22) Filed: Nov. 18, 2008

(65) Prior Publication Data

US 2009/0137084 A1 May 28, 2009

(30) Foreign Application Priority Data

Nov. 27, 2007 (JP) ................... 2007-306097

(51) Int. Cl.
*H01L 23/34* (2006.01)
*H01L 21/00* (2006.01)
*B23K 31/10* (2006.01)

(52) U.S. Cl. . 257/724; 257/738; 257/778; 257/E23.021; 438/108; 228/180.22

(58) Field of Classification Search .................... None
See application file for complete search history.

(56) References Cited

U.S. PATENT DOCUMENTS

| 7,459,339 B2 * | 12/2008 | Masumoto ..................... 438/106 |
| 2002/0162215 A1 * | 11/2002 | Kledzik ........................... 29/650 |
| 2003/0075939 A1 * | 4/2003 | Bendat et al. ................. 294/64.1 |

FOREIGN PATENT DOCUMENTS

| JP | 9-219417 | 8/1997 |
| JP | 2000-260827 | 9/2000 |
| JP | 2000-294602 | 10/2000 |
| JP | 2004-47670 | 2/2004 |
| JP | 2004-119594 | 4/2004 |
| JP | 2005-203664 | 7/2005 |

* cited by examiner

*Primary Examiner* — Alonzo Chambliss
(74) *Attorney, Agent, or Firm* — McGinn IP Law Group, PLLC (57) ABSTRACT

Disclosed herewith is a semiconductor module manufacturing apparatus capable of reducing occurrence of warping of the wiring substrate, etc., as well as occurrence of failures of bonding between the wiring substrate and semiconductor chips, etc. without lowering the productivity. The semiconductor module manufacturing apparatus employs a batch reflowing process that heats one, two, or more wiring substrates and at least two or more semiconductor chips or semiconductor devices simultaneously. After the heating process, the semiconductor chips or semiconductor devices are heated and bonded on the wiring substrate. The apparatus includes at least a stage for chucking the wiring substrate fixedly; a heat source for heating the semiconductor chips or semiconductor devices out of contact therewith; and a controller for controlling the heating value of the heat source.

12 Claims, 11 Drawing Sheets

A-A' CROSS SECTIONAL VIEW

FIG. 16

METHOD AND APPARATUS FOR MANUFACTURING SEMICONDUCTOR MODULE

FIELD OF THE INVENTION

The present invention relates to an apparatus and a method for manufacturing semiconductor modules by bonding a plurality of semiconductor chips or semiconductor devices on a wiring substrate in a batch reflow process.

BACKGROUND OF THE INVENTION

A semiconductor module includes semiconductors, etc., each consisting of many circuit elements such as transistors, resistors, capacitors, etc. that are mounted on a wiring substrate and wired to each another so as to achieve required operations and functions. Various methods are employed for such wiring between each semiconductor chip and the wiring substrate. For example, one of the methods is wire bonding that uses gold wires and another is a flip chip method that bonds each semiconductor chip directly to the surface of an object wiring substrate. At the back side of the wiring substrate having the semiconductor chip, etc. are formed external terminals with solder balls.

Figure 3:
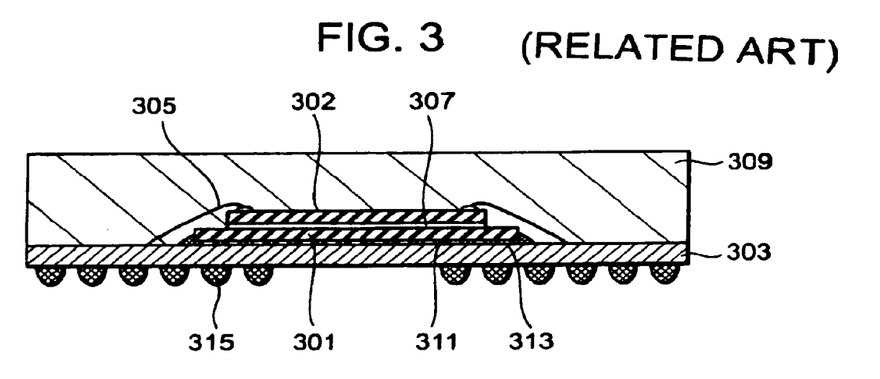
FIG. 3 is a cross sectional view of an example of a semiconductor module structure that employs the flip chip method.
Figure 4:
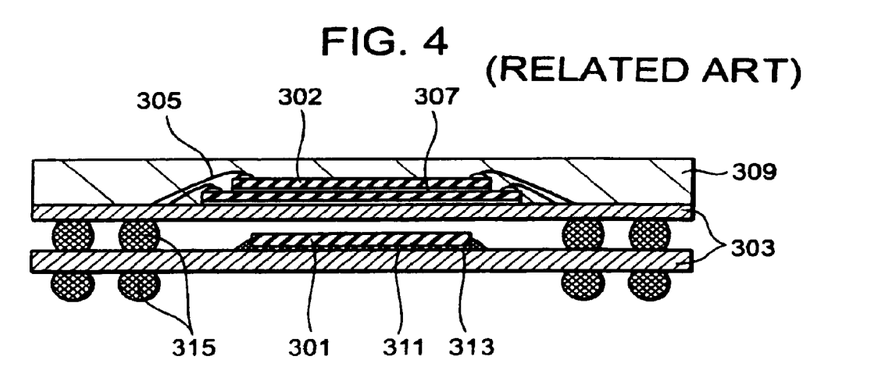
FIG. 4 is another cross sectional view of the example of a semiconductor module structure that employs the flip chip method.

A high density packaging technology includes two techniques: one is SoC (System on Chip) and the other is SiP (System in Package). The SoC enables a plurality of functions to be integrated into one system on a silicon chip and the SiP enables the functions of a memory, a CPU (Central Processing Unit), etc. to be integrated into one package. At present, attention is paid to the SiP technique as a supplemental technique for the SoC. Hereunder, there will be described how the flip chip method is applied to the SiP technique. FIGS. 3 and 4 show an example of a package structure obtained by applying the flip chip method to the SiP technique. In FIGS. 3 and 4, connection terminals (solder bumps 313) of a semiconductor chip 301 are disposed in accordance with the concept of area (full grid) arrangement. Actually, however, one or two rows of them at the outer periphery may be disposed in accordance with the concept of peripheral arrangement.

FIG. 3 is a schematic diagram of a semiconductor module having a semiconductor chip 301 mounted on a wiring substrate 303, as well as another semiconductor chip 302 stacked on the chip 301 by a chip stacking technique. The chip 302 is connected to the wiring substrate 303 of a base package with a wire 305. The semiconductor chips 301 and 302 are covered by mold resin 309. Under the wiring substrate 303 are provided solder balls 315. In FIG. 4, the semiconductor module has the semiconductor chip 301 mounted on the wiring substrate 303, then another semiconductor package 309 is stacked on the wiring substrate 303 by a PoP technique to be described later. In any of the cases shown in FIGS. 3 and 4, the wire bonding method can be employed. However, in order to correspond to signal processings that are speeded up more and more, the flip chip method should preferably be employed to connect the signal terminals to the wiring substrate 303.

The PoP (Package on Package) technique is one of the SiP techniques and used to stack packages one upon another. When compared with the chip stacking technique, at present the PoP technique has such merits as yield improvement, as well as productivity improvement and cost reduction achieved by easiness of test performance. The PoP technique also has other merits such as easiness of problem analysis in troubles occurrence and fast and high density packaging realized by a co-packaging method employed for passive parts.

Furthermore, the PoP technique also enables packages sold on the markets to be mounted together, so its application is diversified. And the PoP technique can also correspond to various module forms and shapes flexibly, thereby improving the flexibility in module designing.

The flip chip method enables fast processings and effective utilization of wire bonding are as favorably. On the other hand, the flip chip method requires high temperatures for packaging processes and the temperature, when it is cooled to the room temperature, comes to change significantly in a wide range. Consequently, the thermal expansibility difference between the semiconductor chip and the wiring substrate becomes remarkable; thereby the semiconductor chip and the substrate are apt to warp significantly. In case of the wire bonding method, the temperature required for processes is about 150° C. In case of the flip chip method, the required temperature becomes 200° C. or over in some cases. Particularly, now that the number of terminals often exceeds 500 pins in most advanced semiconductor chips, solder is required to connect those pins with use of the flip chip method. And if the Pb solder is used, the required heating temperature becomes 220° C.

Furthermore, in case of the flip chip method, processes are varied among the semiconductor chips and among the materials used for the junctions of the wiring substrates. The processes employed in the flip chip method are roughly divided into two. One is the local reflow process, which uses such techniques as pressure bonding or the like to bond the surface of each semiconductor chip is faced to an object wiring substrate and bonded thereon. The other is the batch reflow process, which puts a plurality of such objects as semiconductor chips on multiple forming wiring substrates or a plurality of wiring substrates and they are flown together into a reflowing oven as are, thereby they are heated and bonded together respectively.

The local reflow process is described in various documents. JP-A-2004-47670 (Patent document 1) describes a method for pressing a heated semiconductor chip onto a substrate chucked and retained on a stage. The patent document 1 also describes a means for forcibly cooling the substrate from the side of the stage. JP-A-2000-260827 (Patent document 2) describes how to keep a temperature of an object circuit substrate lower than a temperature of an object semiconductor chip with use of a cooling device provided on a stage used to retain circuit substrates. As described in the patent documents 1 and 2, the methods reduce the difference of thermal expansibility between the substrate and the semiconductor chip, thereby preventing the package from warping. JP-A-HEI9-219417 (Patent document 3) describes a method for suppressing such package warping by heating and cooling so that the thermal profile becomes approximately the same between the substrate and the semiconductor device to be mounted on the substrate. Furthermore, JP-A-2000-294602 (Patent document 4) describes a method for directly heating an object chip entirely with use of a laser beam, thereby preventing the object package from warping and unstable connection.

In case of the local reflow process, wiring substrates can be fixed on a stage for heating and bonding, so the process can assure favorable connection for packages. Thus bonding failures cannot occur so easily between wiring substrates and semiconductor chips, which otherwise might occur due to warped wiring substrates in heating processes. In spite of this, bonding is required for each semiconductor chip, so the process is disadvantage in productivity. And in any of the methods described in the above four patent documents, the local reflow process is employed, so the productivity is low.

On the other hand, in case of the batch reflow process, a plurality of wiring substrates are disposed on a stage and a plurality of semiconductor chips are put on those substrates respectively, then they are flown together into a reflow oven, so the process is favorable in productivity. In this case, wiring substrates put on a belt conveyer are just transferred continuously; the substrates are not fixed on the belt conveyer. Consequently, bonding failures occurrence is still anticipated between semiconductor chips and wiring substrates due to the packages warped in a heating process. JP-A-2004-119594 (Patent document 5) describes a method for two or more ICs mounted on a substrate are put between one flat pressing part and one wiring substrate supporting part, then those two ICs are bonded onto the substrate together through an elastic part. Furthermore, JP-A-2005-203664 (Patent document 6) describes a method that uses a jig capable of correcting warping of wiring substrates. Even through, each of those methods described above still requires methods for preventing warping to be caused by a heating process without lowering the productivity to eliminate such bonding failures that might otherwise occur between semiconductor chips and wiring substrates. Particularly, now that wiring substrates are being thinned more and more, warping in heating processes comes to increase. And thinner semiconductor modules are kept required for mobile phones, etc., so bonding failures are becoming more serious problems.

SUMMARY

According to the present invention, it is possible to provide a semiconductor module manufacturing apparatus, which employs a batch reflow process that heats a plurality of semiconductor chips or semiconductor devices simultaneously to heat and bond those semiconductor chips or semiconductor devices on at least one or more wiring substrates. The apparatus includes a stage for fixing a wiring substrate by chucking; a heat source for heating a plurality of semiconductor chips or semiconductor devices disposed on the wiring substrate out of contact therewith; and a controller for controlling the heating value of the heat source.

Furthermore, according to the present invention, it is possible to provide a method for manufacturing a semiconductor module by employing the batch reflow process that heating one, two, or more wiring substrates and a plurality of semiconductor chips or semiconductor devices simultaneously. The method includes the steps of (a) hastening one, two, or more wiring substrates chucked on a stage; (b) disposing a plurality of the semiconductor chips or semiconductor devices on the wiring substrate; and (c) heating those semiconductor chips or semiconductor devices out of contact therewith with use of a heat source of which heating value is controlled, thereby heating and bonding the semiconductor chips or semiconductor devices onto the wiring substrate to complete the semiconductor module.

According to the present invention, the wiring substrate is chucked fixedly on the stage as described above. Consequently, the method can prevent the wiring substrate from rattling and shaking in a heating process (from displacing from the specified position on the stage due to the warping), thereby preventing warping occurrence. Thus semiconductor chips or semiconductor devices can be prevented from bonding failures. Furthermore, the batch reflow process employed for the method can prevent wiring substrates, semiconductor chip, etc. from warping and bonding failures without lowering the productivity.

According to the present invention, it is possible to provide an apparatus and a method for manufacturing a semiconductor module capable of preventing wiring substrates etc. from warping, as well as reducing bonding failures that might otherwise occur between wiring substrates and semiconductor chips, etc.

BRIEF DESCRIPTION OF THE DRAWINGS

The above and other objects, advantages and features of the present invention will be more apparent from the following description of certain preferred modes taken in conjunction with the accompanying drawings, in which.

DETAILED DESCRIPTION OF THE PREFERRED EMBODIMENTS

Before describing the present invention, the related art of the invention will be explained in detail with reference to FIG. 5 in order to facilitate the understanding of the present invention.

FIG. 5 is a cross sectional view of a semiconductor chip with respect to an image of a batch reflow process. In FIG. 5, only one semiconductor chip is shown to simplify the drawing. Actually, it might often occur that a plurality of semiconductor chips are mounted on a multiple forming wiring substrate and a plurality of semiconductor chips are collectively mounted on a plurality of wiring substrates arranged on a jig. In FIG. 5, it is premised to be structured simplify so that solder bumps 313 are formed at the side of the semiconductor chip 301 and metal lands 304 are formed at the side of the wiring substrate 303.

Figure 5A:
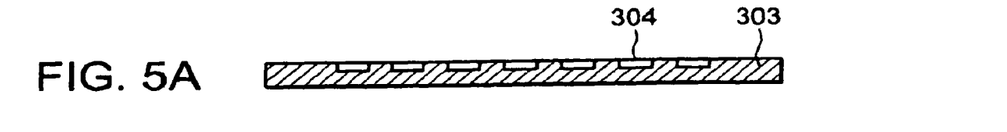
FIG. 5A, FIG. 5B, FIG. 5C, FIG. 5D, FIG. 5E, FIG. 5F, and FIG. 5G are cross sectional views of the semiconductor module structure for describing the batch reflow process.
Figure 5B:
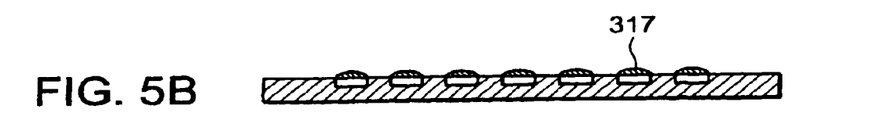
Figure 5C:
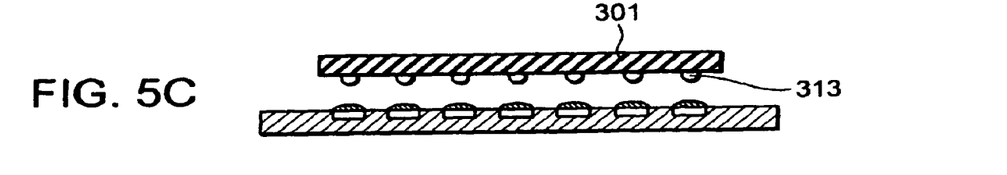
Figure 5D:
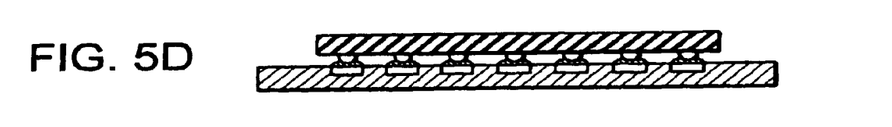
Figure 5E:
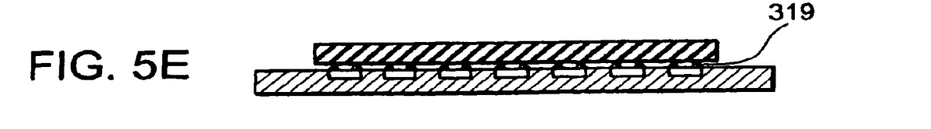
Figure 5F:
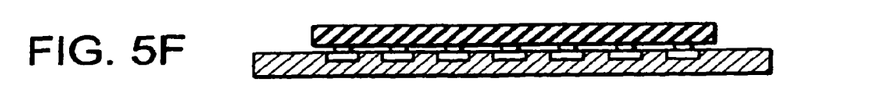
Figure 5G:
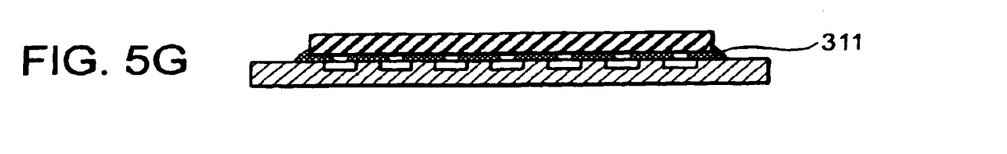

At first, an activator such as flux 317 is supplied onto the metal lands 304 provided on the wiring substrate 303 (FIGS. 5A and 5B). The activator removes the oxide film formed on the surface of the solder. This lead to improve the bonding of the semiconductor chip 301 when mounting the semiconductor chip 301 on the wiring substrate 303. The flux 317 (activator) can be supplied by transferring it onto the bumps 313 formed on the semiconductor chip 301, printing it on the metal lands 304, or by other means such as spraying, pin-transferring. In FIG. 5, the flux 317 is supplied to the metal lands 304 of the wiring substrate 303. After this, the semiconductor chip 301 and the wiring substrate 303 are aligned at junctions respectively (FIG. 5C) so that the semiconductor chip 301 is mounted correctly on the wiring substrate 303 (FIG. 5D). Then, each pair of the semiconductor chip 301 and the wiring substrate 303 is flown into a reflow oven. Thus the semiconductor chip 301 and the wiring substrate 303 are heated and bonded into one. After this, the residual flux 319 is washed off by a cleaning agent (FIGS. 5E and 5F). Then, protective under-fill resin 311 is filled into the junctions and the resin is then cured (FIG. 5G).

Figure 6A:
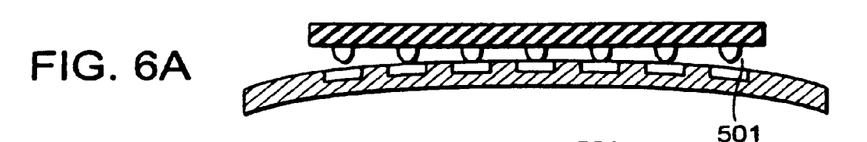
FIG. 6A and FIG. 6B are diagrams for describing problems to be caused by warped wiring substrates.
Figure 6B:
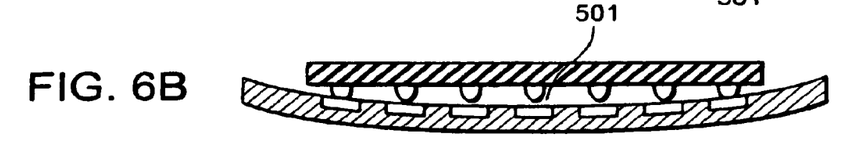
Figure 7A:
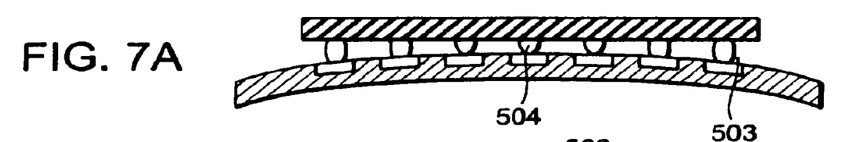
FIG. 7A and FIG. 7B are also diagrams for describing problems to be caused by warped wiring substrates.
Figure 7B:
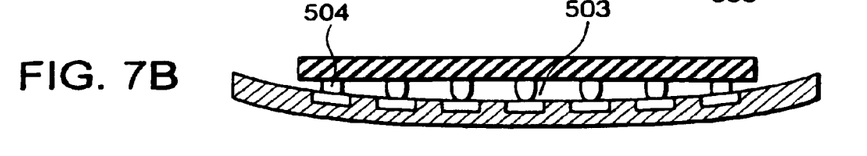

Actually, however, things do not go as shown in FIG. 5; warping always occurs in heating processes. The wiring substrate 303 consists of mainly Cu wirings and a resin material and the density of the Cu wirings is not uniform in the wiring substrate 303. In addition, the density of the resin material also differs between the front and back sides of the wiring substrate 303. This is why not-bonded junctions 501 as shown in FIG. 6 are generated due to the warping of the wiring substrate 303. Even when junctions 501 are bonded successfully, the gaps between the semiconductor chip 301 and the wiring substrate 303 might come to be varied as shown in FIG. 7. In FIG. 7, gaps come to be varied in size just like large gaps 503 and small gaps 504.

Figure 8A:
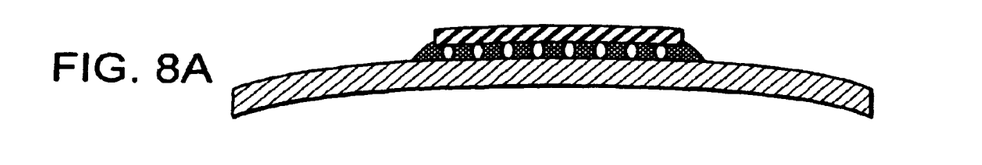
FIG. 8A and FIG. 8B is a diagram for showing a general shape of a warped base package having a semiconductor chip mounted thereon according to the flip chip method.
Figure 8B:
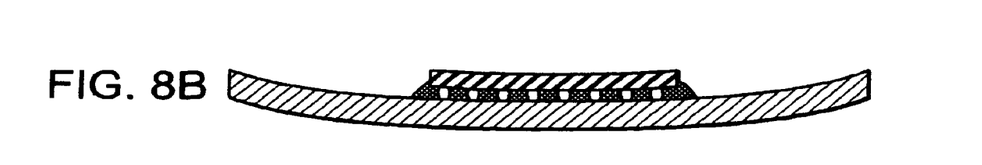

In the patent documents 1 to 6, how to prevent such warping of the wiring substrate is described. However, as described above, the flip chip method requires high temperatures in packaging processes. Therefore the temperature variation is significantly large when it is cooled down to the room temperature. Furthermore, the warping of the wiring substrate further increases because the difference of thermal expansibility among the silicon used for the semiconductor chip, the Cu wiring of the wiring substrate, and the resin material is remarkably large. FIG. 8 shows a cross sectional view of a base package having a general warping shape. Because of the structure of the base package, the package is apt to warp upward at the room temperature (hereunder, to be described as Cry warping) and the package is apt to warp downward at a melting temperature of the solder (hereunder, to be referred to as Smile warping) (FIG. 8B).

Figure 9A:
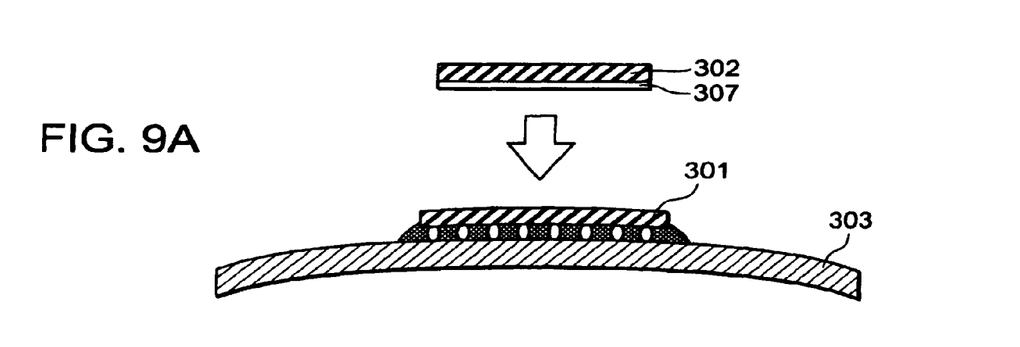
FIG. 9A and FIG. 9B are diagrams for describing problems to occur when another semiconductor chip is stacked on a warped semiconductor chip.
Figure 9B:
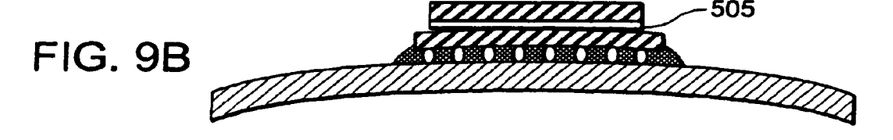
Figure 10A:
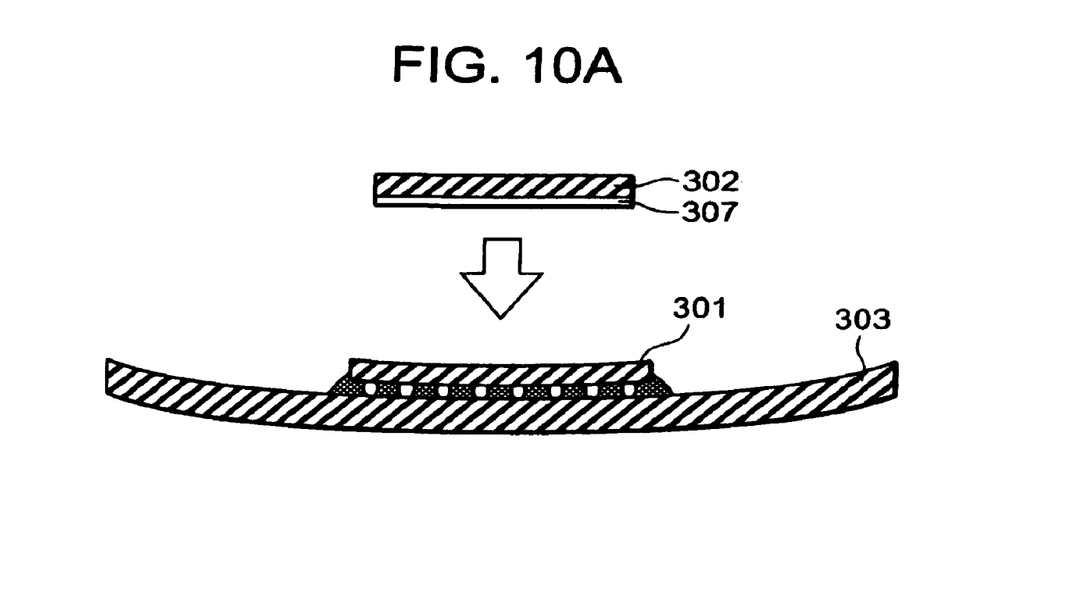
FIG. 10A and FIG. 10B are diagrams for describing problems to occur when another semiconductor chip is stacked on a warped semiconductor chip.
Figure 10B:
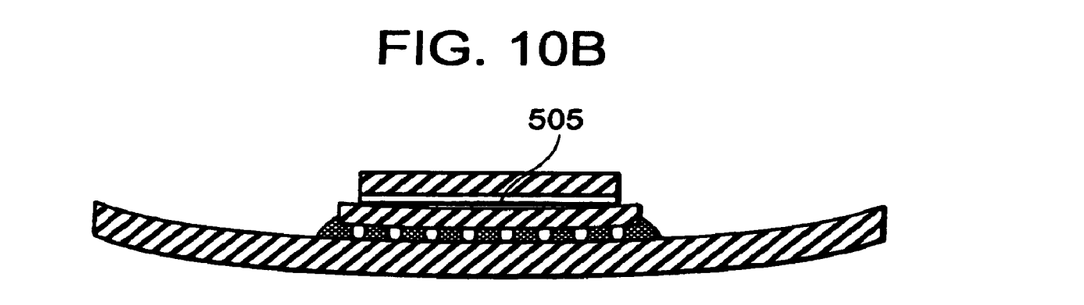

FIGS. 9 and 10 show how to stack a semiconductor chip 302 on a semiconductor chip 301 that is already mounted on a wiring substrate 303 with use of the chip mounting bond 307 according to a chip stacking technique. If the wiring substrate 303 warps at this time, the semiconductor chip 301 also comes to warp accordingly. And furthermore, if a semiconductor chip 302 is stacked on the warped semiconductor chip 301, troubles such as separation 505, might occur.

Figure 11A:
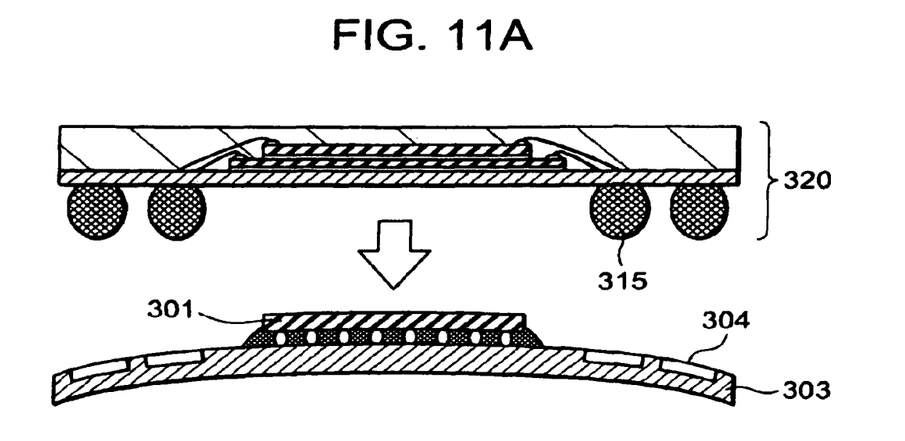
FIG. 11A and FIG. 11B are diagrams for describing problems that might occur when a semiconductor device is further stacked on a warped base package.
Figure 11B:
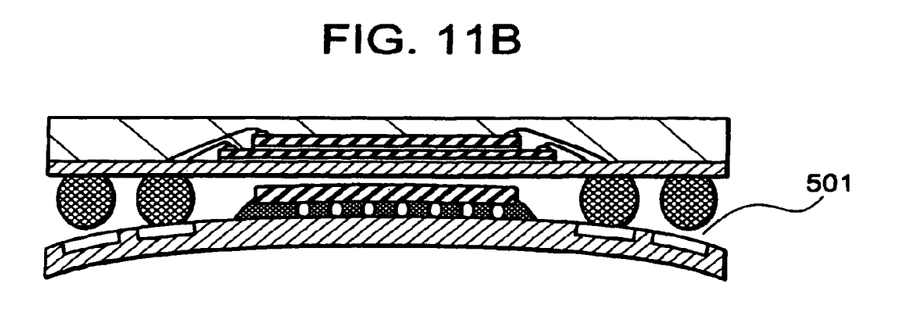
Figure 12A:
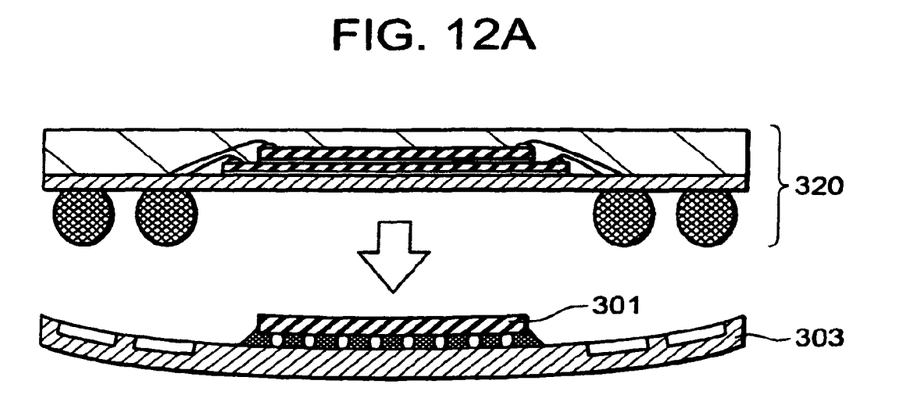
FIG. 12A and FIG. 12B are diagrams for describing problems that might occur when a semiconductor device is further stacked on a warped base package.
Figure 12B:
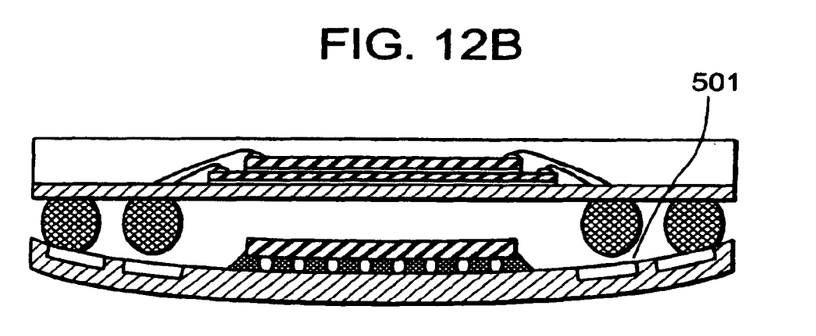

FIGS. 11 and 12 show how to stack a semiconductor package on a semiconductor chip 301 that is already mounted on a wiring substrate 303 according to the PoP (Package on Package) technique. If the base package warps at this time, the package to be stacked (hereunder, described as the child package 320) cannot be bonded properly to the base package (not-bonded junction 501), causing imperfect bonding. Particularly, a semiconductor module manufactured by the PoP technique comes to be bonded higher than the semiconductor module manufactured by the chip stacking technique. In order to prevent this, therefore, the wiring substrate, mold resin are required to be more thinned. Accordingly, the package rigidity is lowered, thereby increasing the warping.

Under such circumstances, it is an object of the present invention to solve such technical problems and improve the flip chip method that employs the batch reflow process.

Next, there will be described an embodiment of the present invention with reference to the accompanying drawings. In all of those drawings, the same reference numerals will be used for the same components, avoiding redundant description.

Hereunder, there will be described a semiconductor module manufacturing apparatus in this embodiment. The apparatus in this embodiment manufactures semiconductor modules by a batch reflow process that heats and bonds a plurality of semiconductor chips or semiconductor devices put on one or more wiring substrates simultaneously.

Figure 1:
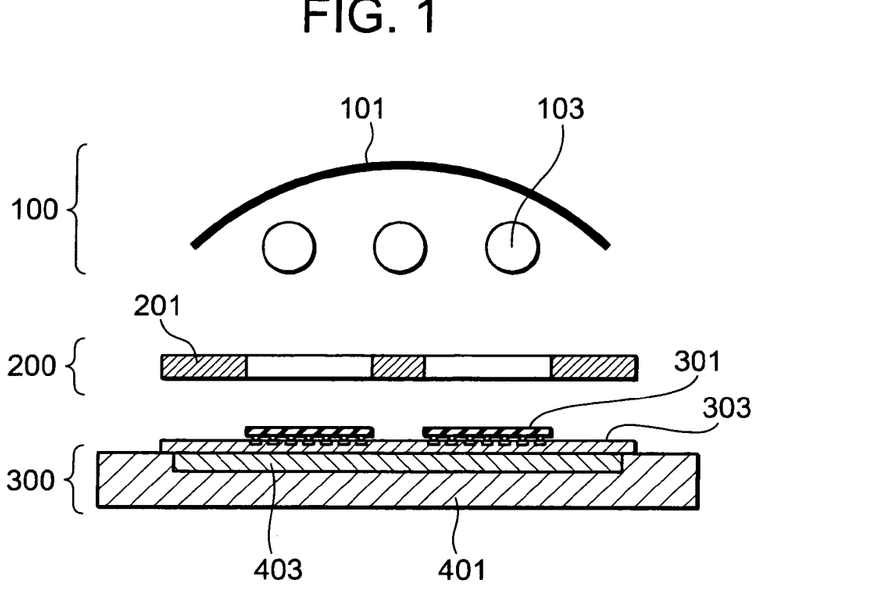
FIG. 1 is an explanatory cross sectional view of an example of a semiconductor module manufacturing apparatus in an embodiment.

FIG. 1 shows an example of the semiconductor module manufacturing apparatus in this embodiment. In FIG. 1, a plurality of semiconductor chips 301 are put on a wiring substrate 303, then they are heated together with the wiring substrate 303 and bonded onto the substrate 303. In this embodiment, a batch reflow process is employed and at least more than two semiconductor chips 301 are bonded onto one or more wiring substrates 303 simultaneously. In this embodiment, therefore, the batch reflow process can achieve more excellent productivity than the local process. In FIG. 1, the wiring substrate 303 is shown simply as a two-by-two semiconductor chip forming wiring substrate 303. In FIG. 1, only two semiconductor chips are shown on this wiring substrate 303 and two other semiconductor chips are provided behind them in the depth direction.

In this embodiment, the wiring substrate 303 is a multiple forming wiring substrate and a plurality of semiconductor chips 301 are put on one wiring substrate 303. However, it is also possible to arrange a plurality of wiring substrates on a stage and a plurality of semiconductor chips 301 on those wiring substrates respectively so as to mount all of those simultaneously in a batch reflow process.

The wiring substrate 303 is put on the stage 300, then chucked fixedly thereon. The stage 300 includes a wiring substrate chucking stage 401 for chucking and fixing the wiring substrate 303. The wiring substrate, which is kept chucking fixedly on the stage 300, can thus prevent the wiring substrate 303 from shaking and rattling that might otherwise be caused by its deformation in a heating process in the batch reflow oven. Because the wiring substrate 303 is prevented from deformation, the semiconductor chips 301 can be bonded properly at desired positions, thereby avoiding the above bonding failure problem. Furthermore, because the wiring substrate 303 is chucked fixedly as described above, the wiring substrate 303 is set right and prevented from being warped, so that the semiconductor chips 301 mounted on the substrate 303 can also be prevented from being warped. This is why the present invention can avoid the bonding failure problem having been caused by such warping.

Figure 15A:
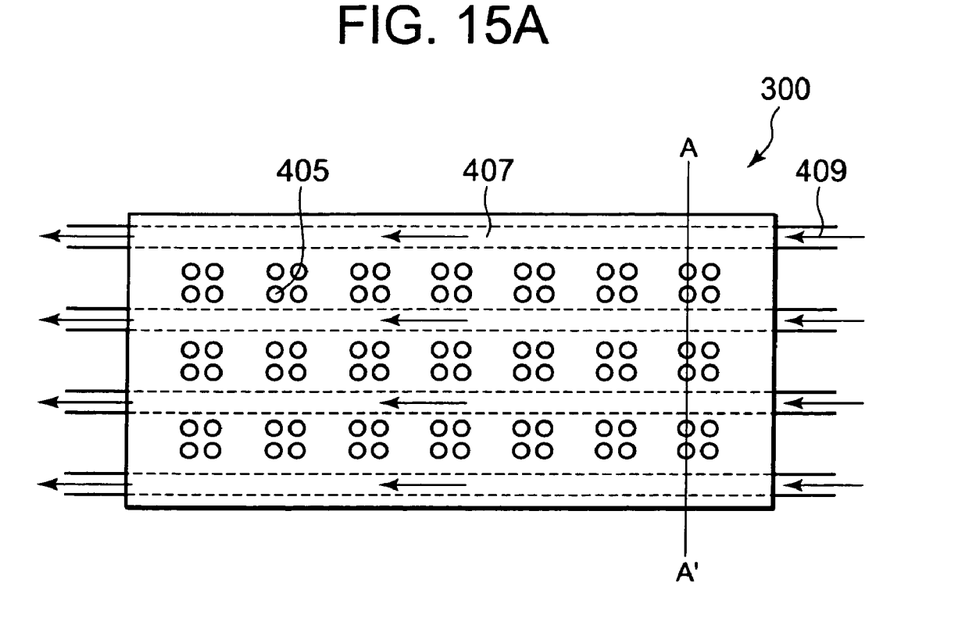
FIG. 15A and FIG. 15B are top and cross sectional explanatory views of an example of a stage structure in the embodiment.
Figure 15B:
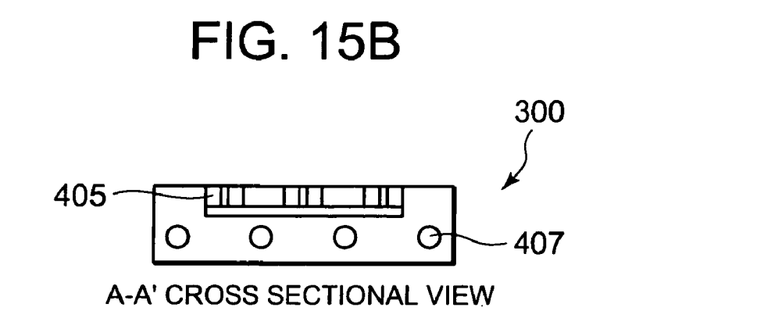
Figure 16:
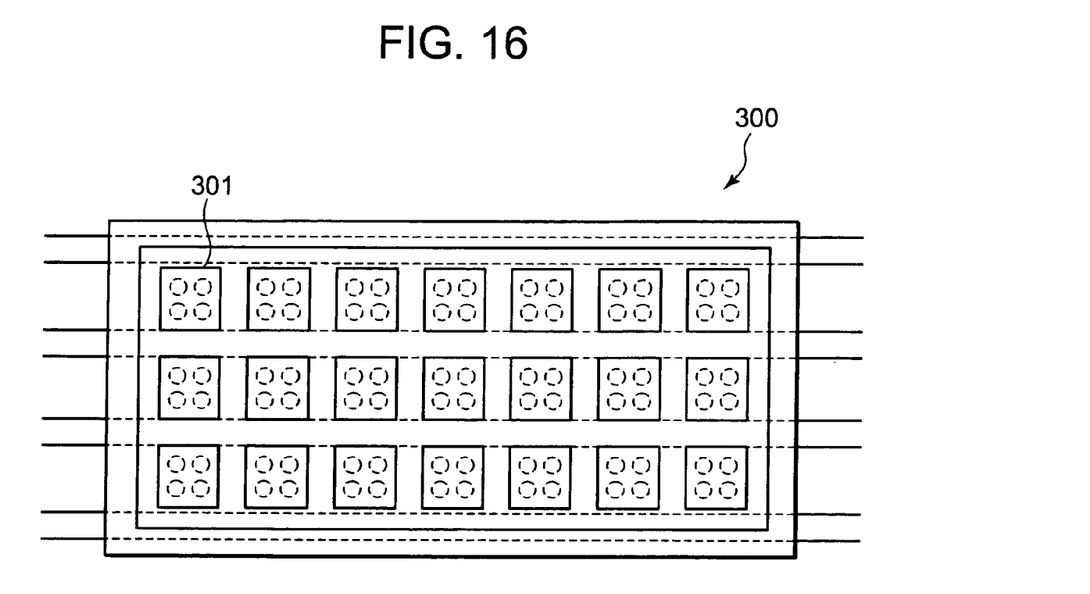
FIG. 16 is an explanatory top view of the example of the stage structure in the embodiment.

Here, the wiring substrate chucking stage 401 should preferably vacuum-chuck to fix the wiring substrate 303. The above fixing method of the wiring substrate 303 may also be combined with another physical fixing method that uses a jig, etc. The structure of the stage 300 is not specially limited; it is just required to chuck and fix the wiring substrate 303 on the stage. For example, when the wiring substrate 303 is vacuum-chucked, the wiring substrate 303 is chucked in a chucking groove formed in a chucking plate positioned at the outer periphery or positioned partially at the inner periphery of the disposed base package or by a chucking plate formed as an entirely porous one. FIG. 15 shows such an example of the structure of the stage 300. FIG. 15A is a top view of the stage 300 and FIG. 15B is a cross sectional view taken on line A-A' of FIG. 15A. In FIG. 15, many vacuum holes 405 are provided in the stage 300 and the wiring substrate 303 is disposed on the stage 300. The wiring substrate 303 is vacuum-chucked through the vacuum holes 405 and fixed on the stage 300. FIG. 16 shows how the wiring substrate 303 is put on the stage 300.

The material of the stage 300 is not limited specially; it is just required to be usable in there flow oven. For example, the stage 300 may be made of metal such as stainless steel, ceramics.

Figure 2:
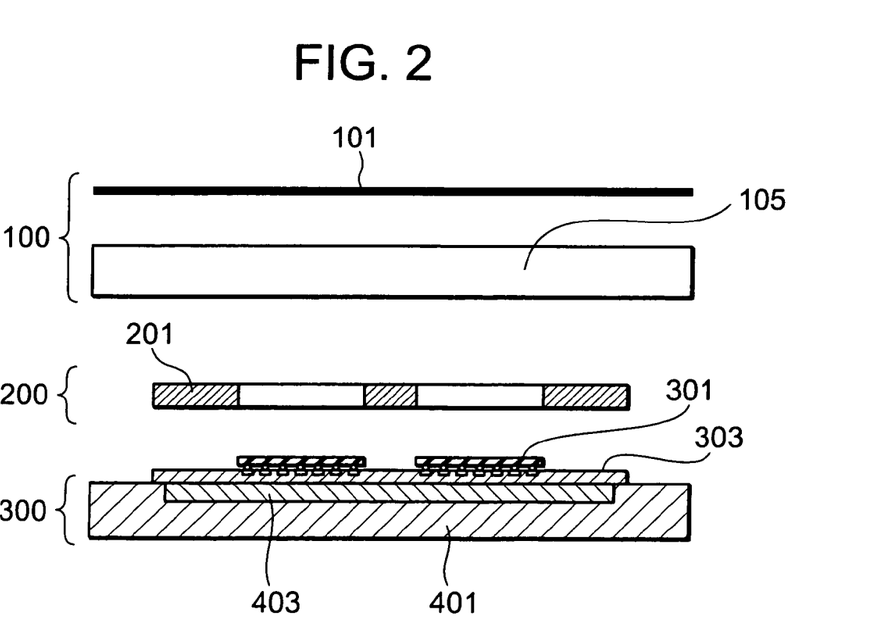
FIG. 2 is another explanatory cross sectional view of the example of the semiconductor module manufacturing apparatus in the embodiment.

The semiconductor module manufacturing apparatus in this embodiment further includes a heat source 100 for heating semiconductor chips 301 out of contact therewith. In case of the local reflow process, heating is usually made by means of solid thermal transmission through devices. On the other hand, this embodiment employs the batch reflow process, so the semiconductor chips 301 are not heated one by one; a plurality of semiconductor chips 301 are heated out of contact simultaneously and evenly by the heat source 100. The heat source 100 may be any one if it can heat those semiconductor chips 301 out of contact therewith. Usually, the semiconductor chips 301 are expected to be heated from above by means of convection heating or radiation heating. For example, the heat source 100 may be an infrared ray (IR) heater, a hot air blower, a heater block, or a combination of those elements. As a concrete example of such a heat source configuration, for example, FIG. 1 shows a combination of an IR heater 103 and a reflection plate 101 and FIG. 2 shows a combination of a heater block 105 and a reflection plate 101. The heat source 100 or reflection plate 101 can be adjusted in size, length, thickness, and quantity according to the area of the wiring substrate 303. Furthermore, the IR heater 103, the reflection plate 101, or the like can also be vibrated for the heating.

Furthermore, the semiconductor module manufacturing apparatus in this embodiment includes a controller (not shown) for controlling the heating value of the heat source 100. In case of usually-used batch reflow ovens, the wiring substrates are carried on a belt conveyor continuously and the heat source output is kept constantly. Consequently, the temperature profile (temperature changes) is realized by moving the object substrates in the oven. On the other hand, in this embodiment, even when wiring substrates are fixed at the same positions, the temperature profile of the heat source 100 can be controlled by controlling the heating value. As examples of the controller for controlling the heating value of the heat source 100 in such a way, there are, for example, a switch for turning on/off the heat source 100, a heat source mover for moving the heat source 100 away from the stage 300, and a heat shielding plate provided between the heat source 100 and the stage 300. It is also possible to turn off the heat source and move the heat source away after heating, thereby intercepting the heat from the heat source 100 in a cooling process. This realizes efficient cooling for the semiconductor modules. Furthermore, the heating value can be controlled to prevent the stage from being heated excessively and prevent the continuous heating in the oven. Thus the stage temperature can be adjusted more easily.

Figure 14:
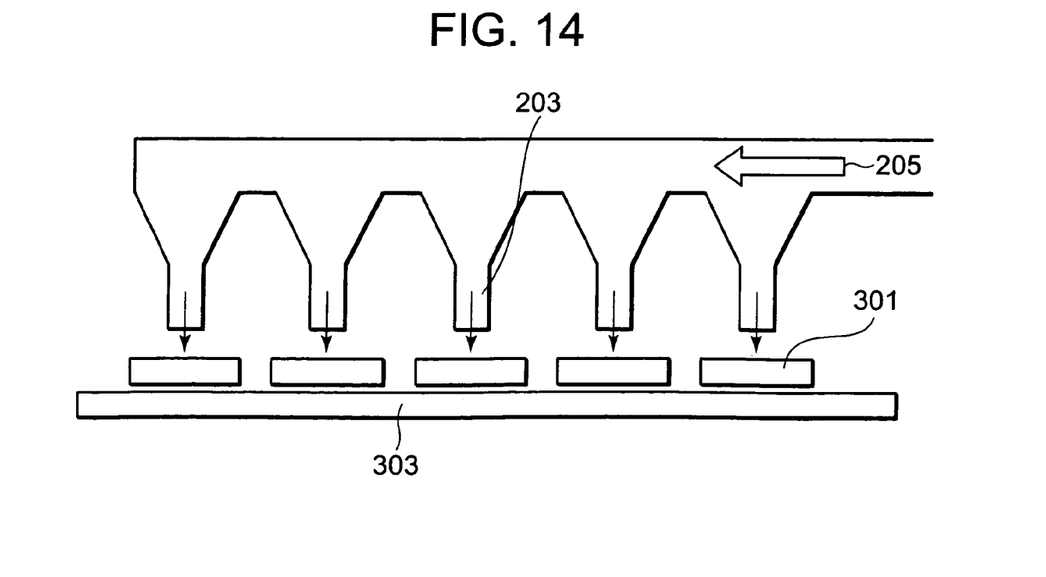
FIG. 14 is a cross sectional view of an example of a heating suppressing device in the embodiment.

The semiconductor module manufacturing apparatus in this embodiment may also include a heating suppressing device 200 for selectively heating the semiconductor chips 301. The heating suppressing device 200 also prevents heating by the heat source 100 on exposed surface portions of the stage where no semiconductor chip 301 is disposed. Consequently, the heating suppressing device 200 can prevent the surface of the stage 300 from being heated, thereby heating only the semiconductor chips 301. As an example of the heating suppressing device 200, there is a shading mask 201 provided between the heat source 100 and the wiring substrate 303 on which the semiconductor chips 301 are put as shown in FIG. 1. The shading mask 201 is made of, for example, a light-shielding material and has slits, glass, or the like only at areas having the semiconductor chips 301. As another example of the heating suppressing device 200, there is a mechanism as shown in FIG. 14. The mechanism functions as the heat source 100 that blows out a hot air and nozzles 203 that function as the heating suppressing device 200 and are disposed selectively above the semiconductor chips 301 are utilized in FIG. 14. The semiconductor chips 301 can thus be heated selectively by the hot air blown out from the nozzles 203 disposed above those chips 301. Then, the heating suppressing device 200 can heat the semiconductor chips 301 and prevent the stage 300 from being heated excessively by the heat source 100. This makes it possible to adjust the temperature of the stage 300 easily. Furthermore, the wiring substrate 303 can be prevented from being deformed, warped, and damaged that might otherwise be caused by excessive heating of the stage 300.

The semiconductor module manufacturing apparatus in this embodiment may also include a temperature controller 403 for controlling the temperature of the stage 300. The temperature controller 403 can make a temperature of the stage go up/down to control a temperature of the wiring substrate 303 chucked fixedly on the stage 300. This makes it possible to control temperatures of the semiconductor chips 301 and that of the wiring substrate 303 independently of each other. Furthermore, such independent temperature controlling makes it possible to prevent warping that might otherwise occur due to the difference of thermal expansibility between each semiconductor chip 301 and the wiring substrate 303. For example, cooling the stage 300 by water or air makes it possible to control a temperature of the wiring substrate 303 when in heating and cooling. FIG. 15 shows an example of the structure of such a temperature controller 403. In FIG. 15, cooling pipes 407 are provided in the stage 300. And a coolant 409 is flown in those cooling pipes 407 to cool the stage 300, thereby indirectly cooling the wiring substrate 303 put on the stage 300.

Furthermore, it is also possible to cool the stage 300 beforehand so as to cool the wiring substrate 303 indirectly in such a way. And making a difference in temperature between each semiconductor chip 301 and the wiring substrate 303 at the time of bonding in such a way makes it possible to adjust the difference of thermal expansibility between silicon or the like used to form the semiconductor chips 301 and the resin, Cu wirings, or the like of the wiring substrate 303.

Figure 13:
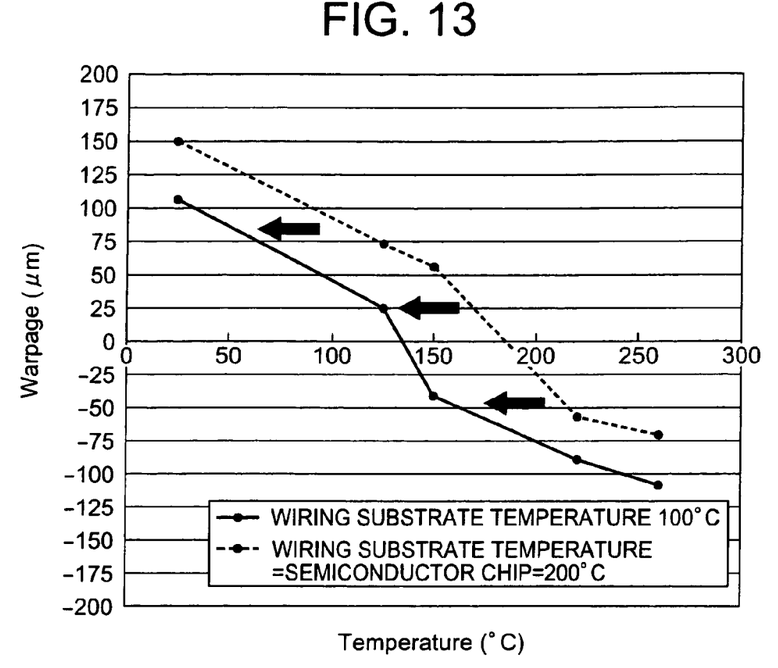
FIG. 13 is a graph for showing a warping state of a base package when the temperature of the wiring substrate is controlled.

FIG. 13 shows concrete data of temperature controlling obtained when the temperature controller 403 for controlling the temperature of the stage 300 is used to control the temperature of the wiring substrate 303. In FIG. 13, the vertical axis shows how much the wiring substrate 303 warps (μm) and the horizontal axis shows the temperature (° C.) of the semiconductor chips 301. The data shown in FIG. 13 is obtained after correcting the position of the wiring substrate 303 by using a vacuum chucking stage so as to exclude the warping factor from the heating process for the wiring substrate 303. When each semiconductor chip 301 is to be bonded to the wiring substrate 303 through a batch reflow process, the temperatures of each semiconductor chip 301 and the wiring substrate 303 is usually assumed to be the same. And it is also premised here that the solder fusing temperature is 200° C., the thermal expansibility of Si is 3 ppm, and the average thermal expansibility of the wiring substrate is 14 ppm when the temperature is within 25° C. to 200° C. If each semiconductor chip 301 is bonded on the wiring substrate 303 at 200° C. and the pair is cooled down to 25° C., the difference of thermal expansibility becomes 11 ppm×[temperature difference: 175° C.]=1925 ppm. Consequently, warping occurs at a stress of 1925 ppm. In FIG. 13, the broken line denotes how the warping of the wiring substrate 303 advances in a batch reflow process when the temperature is not controlled.

On the other hand, in the graph shown in FIG. 13, the solid line denotes how the subject semiconductor module will become with respect to warping when the temperature of the wiring substrate 303 is controlled. In this case, the data is obtained by adjusting the stage temperature and cooling down the temperature of the wiring substrate 303 to 100° C. in advance, then by bonding the semiconductor chip 301 to the wiring substrate 303 while the temperature of the wiring substrate 303 is kept at 100° C. The shrinkage coefficient of the semiconductor chip 301 is calculated as follows; [the thermal expansibility: 3 ppm]×[cooling temperature width: (200−25)° C.]=525 ppm. Also the shrinkage coefficient of the wiring substrate is calculated as follows; [the thermal expansibility: 14 ppm]×[cooling temperature width: (100−25)° C.]=1050 ppm. As a result, it is found that the stress of 525 ppm causes warping. Consequently, when a temperature of the wiring substrate is lowered by 100° C., the warping stress comes to be reduced by 1400 ppm. This means that the bonding temperature affects the subsequent warping stress. This is why the stress that functions as a warping factor can be controlled by controlling the temperature of the wiring substrate 303, thereby the warping itself can be controlled.

For example, when it is assumed that the heating temperature of the wiring substrate 303 is Tsub, the temperature of the semiconductor chip 301 is Tchip, the room temperature is RT, the thermal expansibility of the wiring substrate 303 is Asub, and the thermal expansibility of the semiconductor chip 301 is Achip, it is found that no warping occurs at the condition of Asub×(Tsub−RT)=Achip×(Tchip−RT). This means that warping at the room temperature can be controlled completely if the reflow process is carried out at the temperature of the wiring substrate so that the thermal expansibility ratio (Asub/Achip) satisfies (Tchip−RT)/(Tsub−RT).

Next, there will be described how to manufacture semiconductor modules in this embodiment. In this embodiment, the batch reflow process is employed, so at least two or more semiconductor chips are put on one or more wiring substrates and those chips and substrates are heated together.

At first, one or more wiring substrates are chucked fixedly on a stage. The chucking and fixing method may be vacuum-chucking as described above. Then, object semiconductor chips are positioned correctly on the wiring substrates. After this, the semiconductor chips and the wiring substrates are heated in a reflow oven, thereby the semiconductor chips are bonded on the wiring substrates respectively.

In the batch reflow process, the heating and bonding material is required to be used for the junctions of either or both of the wiring substrates and semiconductor chips. Solder is the most popular material used in such a bonding process. On the semiconductor chips, the solder may be supplied to their bumps made of metal, such as Au or Cu, formed at their junctions. The bumps may also be formed with solder. On the wiring substrates, the solder is supplied to the lands made of metal, such as Au or Cu, forming their junctions. As the solder supplying method, for example, there is a solder paste printing method or a plating method.

Semiconductor chips are usually put on the top surfaces of the object wiring substrates. This is because the number of connection terminals of the semiconductor modules comes to be limited if the semiconductor chips are mounted on the bottom surfaces of the wiring substrates having mounting balls. Because the semiconductor chips are mounted on the top surfaces of the wiring substrates in such a way, the terminals of connection to the package to be stacked come to be disposed at the outer periphery of each of the semiconductor chips mounted on the wiring substrates.

A heat source for heating semiconductor chips out of contact therewith is used for the heating and bonding process. The heating value of the heat source can be controlled. For example, the heat source is turned on/off repetitively, thereby the stage and the semiconductor chips can be prevented from being heated continuously. This makes it easier to control the temperature of the stage and cool the semiconductor modules.

Furthermore, in case of the method employed in this embodiment, semiconductor chips should preferably be heated by a heat source out of contact therewith and the temperature of the stage should also be preferably controlled independently. Controlling a temperature of the stage in such a way makes it possible to control a temperature of the wiring substrate on the stage independently of a temperature of the semiconductor chips. For example, a temperature of the stage can be also controlled by heating or cooling the stage. How the object base package warps differs among the materials of the wiring substrates, semiconductor chips, etc., as well as among the structures of those elements. In addition, the base package warping at a predetermined temperature is also affected by the use purpose of the package. Consequently, the warping of the wiring substrates, semiconductor chips, etc. should preferably be controlled independently at a predetermined temperature. For example, because the thermal expansibility of the wiring substrate is usually higher than that of the semiconductor chip, the wiring substrate comes to warp more easily than the semiconductor chip. Either in prior to the heating and bonding process or in prior to the heating process, or in prior to both of those processes, therefore, the stage should preferably be cooled. In the cooling process, the warping stress can be reduced by making a difference in temperature between the wiring substrate and the semiconductor chip.

While the preferred form of the present invention has been described, it is to be understood that modifications will be apparent to those skilled in the art without departing from the spirit of the invention.

For example, while semiconductor chips are mounted on wiring substrates in the above embodiment, it is also possible to further stack another semiconductor chip on a wiring substrate on which a semiconductor chip is already mounted. In addition, a semiconductor device such as a semiconductor package or the like may be mounted on a wiring substrate.

What is claimed is:
1. A semiconductor module manufacturing apparatus, comprising:
   a stage for fixedly chucking a wiring substrate during a batch reflowing process;
   a heat source for heating a plurality of semiconductor chips or semiconductor devices disposed on the wiring substrate out of contact therewith;

a controller for controlling a heating value of the heat source; and a temperature controller for controlling a temperature of the stage in order to control a temperature of the wiring substrate, wherein the heat source employs the batch reflowing process for heating the plurality of the semiconductor chips or semiconductor devices.

2. The apparatus according to claim 1, wherein the stage vacuum-chucks the wiring substrate fixedly, and said fixedly chucking thereby reduces a warping of the wiring substrate during the batch reflowing process.

3. The apparatus according to claim 1, wherein the controller controls the heating value of the heat source by turning on/off the heat source.

4. The apparatus according to claim 1, wherein the controller for controlling the heating value moves the heat source away from the stage to control the heating value of the heat source.

5. The apparatus according to claim 1, wherein the apparatus further includes a heating suppression device, wherein the heating suppression device suppresses heating by the heat source on a portion of the stage on which none of the semiconductor chips and the semiconductor device is disposed.

6. The apparatus according to claim 5, wherein the heating suppression device comprises a light-shielding mask provided between the heat source and each of the semiconductor chips or the semiconductor device.

7. The apparatus according to claim 5, wherein the heat source comprises a hot air source structured to have a nozzle at a position of the heating suppression device, the nozzle corresponding to each of the semiconductor chips or semiconductor devices and capable of supplying the hot air to its corresponding semiconductor chip or semiconductor device selectively.

8. The apparatus according to claim 1, wherein the temperature controller uses cool water or air to control the temperature of the stage.

9. The apparatus according to claim 1, wherein the heat source uses at least one of elements selected from a group consisting of an infrared ray heater, a hot air source, and a heater block.

10. The apparatus according to claim 1, wherein the temperature controller controls the temperature of the wiring substrate in accordance with a ratio between a thermal expansibility of the wiring substrate and that of the plurality of semiconductor chips or semiconductor devices.

11. The apparatus according to claim 10, wherein the temperature controller controls the temperature of the wiring substrate so that the ratio of the thermal expansibility of the plurality of semiconductor chips or semiconductor devices to that of the wiring substrate is substantially same as a ratio of (Tchip−RT) to (Tsub−RT) where Tchip is a temperature of the plurality of semiconductor chips or semiconductor devices during heating the plurality of semiconductor chips or semiconductor devices, Tsub is a temperature of the wiring substrate during heating the plurality of semiconductor chips or semiconductor devices, and RT is a room temperature.

12. A semiconductor module manufacturing apparatus, comprising:

a stage for chucking a wiring substrate fixedly in a manner that reduces a warping of the wiring substrate during a batch reflowing process;

a heat source for out-of-contact heating of a plurality of semiconductor chips and/or semiconductor devices disposed on the wiring substrate during the batch reflowing process;

a controller for controlling a heating value of the heat source; and a temperature control mechanism that selectively controls a temperature of the stage such that a temperature of the chucked wiring substrate is selectively controlled to additionally reduce the warping of the wiring substrate during the batch reflowing process, wherein said temperature control mechanism comprises at least one of:

controlling the heating value of the heat source by selectively turning on/off the heat source;

selectively moving the heat source away from the stage to control the heating value of the heat source upon the wiring substrate;

controlling a temperature of the wiring substrate, using at least one of cool water or cool air; and suppressing heating by the heat source on a portion of the stage on which none of the semiconductor chips and the semiconductor device are disposed by at least one of:

using a light-shielding mask provided between the heat source and each of the semiconductor chips or the semiconductor device; and providing heating nozzles supplying hot air, as directed to semiconductor chips or semiconductor devices rather than the wiring substrate.

* * * * *